United States Patent
Motoki et al.

(10) Patent No.: US 9,618,190 B2
(45) Date of Patent: Apr. 11, 2017

(54) LED MODULE INCLUDING FLEXIBLE PRINTED CIRCUIT BOARD WITH ADHESIVE LAYERS AND LED LIGHTING FIXTURE

(71) Applicants: SUMITOMO ELECTRIC PRINTED CIRCUITS, INC., Koka-shi, Shiga (JP); SUMITOMO ELECTRIC INDUSTRIES, LTD., Osaka-shi, Osaka (JP)

(72) Inventors: Kensaku Motoki, Koka (JP); Yoshihiro Akahane, Koka (JP); Hirohisa Saito, Osaka (JP); Manabu Shiozaki, Yokahama (JP)

(73) Assignees: SUMITOMO ELECTRIC PRINTED CIRCUITS, INC., Koka-shi, Shiga (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/910,265

(22) PCT Filed: Aug. 6, 2014

(86) PCT No.: PCT/JP2014/070775
§ 371 (c)(1),
(2) Date: Feb. 5, 2016

(87) PCT Pub. No.: WO2015/020106
PCT Pub. Date: Feb. 12, 2015

(65) Prior Publication Data
US 2016/0178166 A1 Jun. 23, 2016

(30) Foreign Application Priority Data

Aug. 9, 2013 (JP) .................. 2013-167061
Jan. 15, 2014 (JP) .................. 2014-005455
Aug. 6, 2014 (JP) .................. 2014-159977

(51) Int. Cl.
*B32B 3/00* (2006.01)
*F21V 19/00* (2006.01)
(Continued)

(52) U.S. Cl.
CPC ............ *F21V 19/002* (2013.01); *F21K 9/232* (2016.08); *F21V 29/70* (2015.01); *F21Y 2107/40* (2016.08);
(Continued)

(58) Field of Classification Search
CPC ........ F21V 19/002; F21V 29/70; F21K 9/232; F21Y 2101/00; F21Y 2107/40; F21Y 2115/10; H01L 2924/0002; H01L 25/0753
See application file for complete search history.

(56) References Cited

FOREIGN PATENT DOCUMENTS

JP 2009-170114 A 7/2009
JP 2009-289649 A 12/2009
(Continued)

OTHER PUBLICATIONS

Translation of Written international search report for WO2015020106.*

*Primary Examiner* — Tracie Y Green
(74) *Attorney, Agent, or Firm* — Drinker Biddle & Reath LLP

(57) ABSTRACT

An LED module according to the present invention is an LED module including a plurality of light-emitting diodes, wherein the plural light-emitting diodes are disposed only on a lateral surface of a right cone, a right pyramid, a truncated right cone, or a truncated right pyramid; the lateral surface has an inclination angle of 55° or more and 82° or less with respect to a bottom surface; the plural light-emitting diodes have light-emitting surfaces substantially parallel to the (Continued)

lateral surface; and angles formed between projection lines of lines normal to light-emitting surfaces of adjacent light-emitting diodes or adjacent ones of grouped light-emitting diodes, the projection lines being drawn on the bottom surface, are all equal to each other and are 72° or less.

14 Claims, 11 Drawing Sheets

(51) Int. Cl.
  *F21V 29/70* (2015.01)
  *F21K 9/232* (2016.01)
  H01L 25/075 (2006.01)
  F21Y 115/10 (2016.01)
  F21Y 107/40 (2016.01)
(52) U.S. Cl.
  CPC ....... *F21Y 2115/10* (2016.08); *H01L 25/0753* (2013.01); *H01L 2924/0002* (2013.01)

(56) References Cited

FOREIGN PATENT DOCUMENTS

| | | |
|---|---|---|
| JP | 2011-086711 A | 4/2011 |
| JP | 2011-181384 A | 9/2011 |
| JP | 2012-049369 A | 3/2012 |

\* cited by examiner

LED MODULE INCLUDING FLEXIBLE PRINTED CIRCUIT BOARD WITH ADHESIVE LAYERS AND LED LIGHTING FIXTURE

TECHNICAL FIELD

The present invention relates to an LED module and an LED lighting fixture.

BACKGROUND ART

In recent years, as replacements for existing fluorescent lamps, light-emitting diode (LED) lighting fixtures having, as light sources, light-emitting diodes, which consume low energy and have a long lifetime, have been becoming common.

For light-emitting diodes, each diode has a low luminous intensity. Accordingly, LED lighting fixtures each include plural light-emitting diodes mounted on a printed circuit board. In general, such plural light-emitting diodes are two-dimensionally arranged on a printed circuit board as disclosed in, for example, Japanese Unexamined Patent Application Publication No. 2009-170114.

CITATION LIST

Patent Literature

PTL 1: Japanese Unexamined Patent Application Publication No. 2009-170114

SUMMARY OF INVENTION

Technical Problem

In the existing LED lighting fixture described above, plural light-emitting diodes are two-dimensionally arranged on a printed circuit board that is a flat board. Thus, the light source constituted by the plural light-emitting diodes has directivity. Specifically, the existing LED lighting fixture exhibits a high luminous intensity in the forward direction of the mount surface of the light-emitting diodes (in the normal line direction); however, depending on positions, the luminous intensity decreases as the angle with respect to the forward direction of the mount surface of the light-emitting diodes increases. For this reason, the brightness varies depending on the positional relationship with the LED lighting fixture, which is a disadvantage.

In order to address this disadvantage, an improved LED lighting fixture was developed that includes a prism disposed on the light emission side of light-emitting diodes to laterally refract light emitted by the light source. However, such prism-equipped LED lighting fixtures necessarily involve increased structural complexity and increased cost due to attachment of the prisms.

The present invention has been made under the above-described circumstances. An object of the present invention is to provide an LED module and an LED lighting fixture that allow effective suppression of variation in luminous intensity on the forward side at low cost.

Solution to Problem

Regarding the above-described object, the inventors of the present invention have found that, by disposing light-emitting diodes only on a lateral surface of a right cone or pyramid (or a truncated right cone or pyramid) and by setting the inclination angle of the lateral surface with respect to the bottom surface of the right cone or pyramid to 55° or more and 82° or less, variation in luminous intensity on the forward side of the LED lighting fixture can be markedly suppressed.

Specifically, in order to achieve the object, an embodiment according to the present invention provides an LED module including plural light-emitting diodes, wherein the plural light-emitting diodes are disposed only on a lateral surface of a right cone, a right pyramid, a truncated right cone, or a truncated right pyramid; the lateral surface has an inclination angle of 55° or more and 82° or less with respect to a bottom surface; the plural light-emitting diodes have light-emitting surfaces substantially parallel to the lateral surface; angles formed between projection lines of lines normal to light-emitting surfaces of adjacent light-emitting diodes or adjacent ones of grouped light-emitting diodes, the projection lines being drawn on the bottom surface, are all equal to each other and are 72° or less.

In order to achieve the object, another embodiment according to the present invention provides an LED lighting fixture including the LED module.

Advantageous Effects of Invention

An LED module and an LED lighting fixture according to the present invention allow effective suppression of variation in luminous intensity on the forward side at low cost and reduction in unevenness in brightness on the forward side.

DESCRIPTION OF EMBODIMENTS

Figure 1:
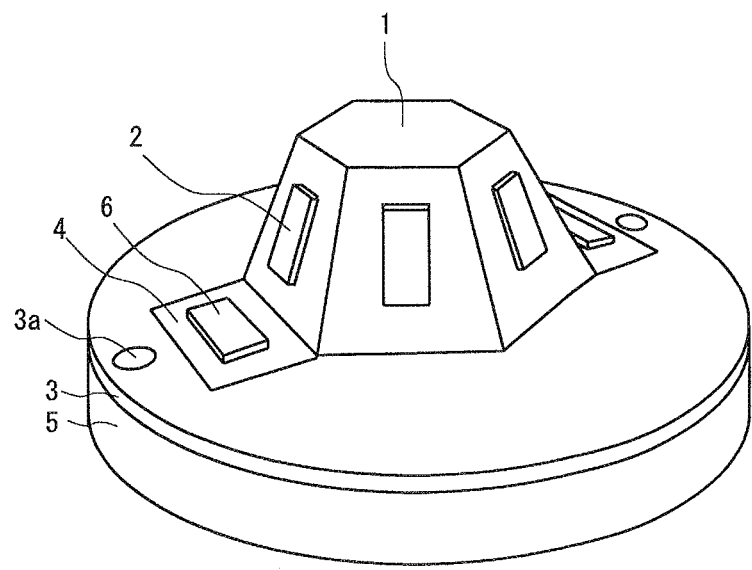
FIG. 1 is a schematic perspective view illustrating an LED module according to an embodiment of the present invention.

Description of Embodiments According to the Present Invention

In order to achieve the object, an embodiment of the present invention provides an LED module including a plurality of light-emitting diodes, wherein the plural light-emitting diodes are disposed only on a lateral surface of a right cone, a right pyramid, a truncated right cone, or a truncated right pyramid; the lateral surface has an inclination angle of 55° or more and 82° or less with respect to a bottom surface; the plural light-emitting diodes have light-emitting surfaces substantially parallel to the lateral surface; and angles formed between projection lines of lines normal to light-emitting surfaces of adjacent light-emitting diodes or adjacent ones of grouped light-emitting diodes, the projection lines being drawn on the bottom surface, are all equal to each other and are 72° or less.

In the LED module, plural light-emitting diodes are three-dimensionally disposed at equiangular intervals of 72° or less in plan view (the polygon formed by linking the centroids of the light-emitting diodes is a polygon having 5 or more vertices), on a lateral surface of a right cone or pyramid (a right cone, a right pyramid, a truncated right cone, or a truncated right pyramid) so as to be substantially parallel to the lateral surface; and the inclination angle of the lateral surface with respect to the bottom surface is set to be within the above-described range. As a result, in the LED module, in all hemispherical directions (on the forward side of the LED module) (on the apex side) extending from the center of the bottom surface of the right cone or pyramid on which plural light-emitting diodes are disposed, variation in luminous intensity depending on the positional relationship with the light source (grouped light-emitting diodes) can be reduced. In addition, the light-emitting diodes are disposed only on the lateral surface, so that the uniformity of luminous intensity in the above-described all hemispherical directions can be markedly enhanced. In summary, the LED module allows, without attachment of a member such as a prism, effective suppression of variation in luminous intensity on the forward side at low cost. Incidentally, the term "substantially parallel" means that an angle formed between a line normal to one surface and another surface is within 90±5°. The term "grouped light-emitting diodes" means a group constituted by plural light-emitting diodes disposed such that angles formed between projection lines of lines normal to light-emitting surfaces, the projection lines being drawn on the bottom surface of the right cone or pyramid or the truncated right cone or pyramid, are 10° or less. The term "lines normal to light-emitting surfaces of the grouped light-emitting diodes" means lines normal to the lateral surface of the right cone or pyramid or the truncated right cone or pyramid, the lines passing through the geometric centroids of plural light-emitting diodes included in the grouped light-emitting diodes.

More preferably, the lateral surface has an inclination angle of 60° or more and 80° or less with respect to the bottom surface. In this way, the inclination angle of the lateral surface with respect to the bottom surface of the right cone, the right pyramid, the truncated right cone, or the truncated right pyramid is set to be within the above-described range, so that the uniformity of luminous intensity in all hemispherical directions for the LED module can be further enhanced.

Preferably, the lateral surface on which the plural light-emitting diodes are disposed includes lateral surfaces of the right pyramid or the truncated right pyramid; at least one light-emitting diode is disposed on each lateral surface; and the right pyramid or the truncated right pyramid has a bottom surface that has a polygonal shape having 5 or more vertices and interior angles all being equal to each other. In this way, as the right cone or pyramid on which light-emitting diodes are disposed, a right pyramid or a truncated right pyramid is employed, so that light-emitting diodes can be easily disposed on the lateral surface of the right cone or pyramid. The bottom surface of the right pyramid or the truncated right pyramid is formed so as to have a polygonal shape having 5 or more vertices and interior angles all being equal to each other, so that the uniformity of luminous intensity around the central axis (in the circumferential rotation direction) of the right cone or pyramid of the LED module can be further enhanced.

The bottom surface of the right pyramid or the truncated right pyramid preferably has an odd number of vertices. The inventors of the present invention have found the following: when light-emitting diodes are disposed on lateral surfaces of a right pyramid or a truncated right pyramid, the effect of enhancing the uniformity of luminous intensity is strongly provided in a case where the number of vertices of the bottom surface of the right pyramid or the truncated right pyramid is an odd number (2n−1 where n represents a natural number), compared with another case where the number of vertices of the bottom surface is an even number (2n) that is larger by 1 than this odd number. The mechanism for this is not completely found; however, when the number of vertices of the bottom surface is an odd number, the arrangement pattern of the light-emitting diodes does not have line symmetry with respect to a line passing through the centroid of the bottom surface, which is probably a cause. Thus, by employing a right pyramid or a truncated right pyramid whose bottom surface has an odd number of vertices, the uniformity of luminous intensity can be more effectively enhanced.

The lateral surface on which the plural light-emitting diodes are disposed may be a lateral surface of the right cone or the truncated right cone, and the light-emitting diodes or the grouped light-emitting diodes may be disposed at equiangular intervals. In this way, as the right cone or pyramid, a right cone or a truncated right cone is employed and plural light-emitting diodes or grouped light-emitting diodes are disposed at equiangular intervals, so that the uniformity of luminous intensity around the central axis (in the circumferential rotation direction) of the right cone or pyramid of the LED module can also be further enhanced.

Preferably, the LED module further includes a metal base material having, in a central portion, a protrusion having a shape of the right cone, the right pyramid, the truncated right cone, or the truncated right pyramid; the plural light-emitting diodes are mounted on a flexible printed circuit board; and the flexible printed circuit board is at least disposed so as to conform to the protrusion of the metal base material. In this way, the flexible printed circuit board on which light-emitting diodes are mounted is disposed on the metal base material having a protrusion, so as to conform to the protrusion, so that the light-emitting diodes can be disposed on the lateral surface of the right cone or pyramid with ease and certainty. As a result, the production cost of the LED module can be further reduced.

The protrusion of the metal base material is preferably formed by die casting, cold forging, cutting, or press molding. Formation of the protrusion in this manner further facilitates production of the LED module, resulting in further reduction in the production cost of the LED module.

The LED module preferably further includes a heat sink on a back surface side of the metal base material. In this way, the LED module includes a heat sink on the back surface side of the metal base material, so that generation of heat in light-emitting diodes is more effectively suppressed, resulting in an increase in the lifetime of the LED module.

Preferably, the flexible printed circuit board includes a base film, a conductive pattern formed on a front surface side of the base film and including at least one land part and a wiring part connected to the land part, and a coverlay formed on a front surface of the conductive pattern and having an opening formed at a position corresponding to the at least one land part; a back surface of the flexible printed circuit board has a recess extending to a back surface of the conductive pattern, the recess corresponding to at least a portion of a projection region of the at least one land part on which each light-emitting diode is mounted; and the flexible printed circuit board further includes a thermally conductive adhesive filling the recess. In this way, the recess extending to the back surface of the conductive pattern is filled with the thermally conductive adhesive, so that the conductive pattern and the metal base material are connected to each other via the thermally conductive adhesive. As a result, the effect of dissipating heat from light-emitting diodes can be markedly enhanced.

The term "land part" means a wiring part of the conductive pattern, the wiring part being enlarged to a size that allows solder bonding for mounting of a chip component at an intermediate position of the wiring circuit. In general, an opening is formed in a portion of the coverlay, the portion corresponding to the land part, to expose the conductive part for solder bonding. Incidentally, when the opening is smaller than the land part, the whole inner surface of the opening serves as a circuit surface (conductive part). Conversely, when the opening is larger than the land part, the opening may contain a pad-shaped circuit surface serving as a land part and a wiring part connected to the circuit surface.

In plan view substantially perpendicular to a surface of the flexible printed circuit board, the base film preferably remains in a region including at least a portion of a peripheral edge of the at least one land part. In this way, the base film is left in a region including at least a portion of the peripheral edge of the land part, so that occurrence of a short circuit due to the conductive pattern coming into contact with the metal base material can be prevented during bonding of the flexible printed circuit board on which light-emitting diodes are mounted, to the metal base material. Incidentally, the term "substantially perpendicular" means that the angle formed with respect to the surface is within 90±5°.

The recess is preferably formed in a region at least covering a projection region of the opening of the coverlay. In this way, by forming the recess in a region covering the projection region of the opening of the coverlay, the effect of dissipating heat from light-emitting diodes can be further enhanced.

Preferably, the recess is formed in a region at least covering a projection region of the light-emitting diode, and the coverlay is present between the plural land parts in plan view substantially perpendicular to a surface of the flexible printed circuit board. In this way, the recess is formed in a region covering the projection region of the light-emitting diode and the coverlay is formed so as to be present between plural land parts, so that the strength of the flexible printed circuit board is maintained and the effect of dissipating heat from the light-emitting diodes can be further enhanced.

Preferably, the flexible printed circuit board has a through hole for each projection region of the at least one land part, and the thermally conductive adhesive fills the through hole and a portion above the through hole and is in contact with a back surface of the light-emitting diode. In this way, a through hole is formed in the flexible printed circuit board, so that, during filling with the thermally conductive adhesive, the thermally conductive adhesive can be prevented from leaking to the outside of the projection region of the land part. In addition, the thermally conductive adhesive is brought into contact with the light-emitting diode via the through hole, so that the effect of dissipating heat from the light-emitting diodes can be further enhanced.

For the right cone, the right pyramid, the truncated right cone, or the truncated right pyramid, in a −90° to 90° radial range with respect to a reference direction extending, from an origin as a center of the bottom surface, along a central axis toward an apex, a variation in luminous intensity for the LED module (a ratio of a maximum luminous intensity to a minimum luminous intensity) is preferably 2.5 or less. In this way, the variation in luminous intensity is set to be within the above-described range, so that variation in the brightness of the LED module depending on the positional relationship with the light source (grouped light-emitting diodes) can be further reduced.

In order to achieve the object, another embodiment of the present invention provides an LED lighting fixture including the LED module.

The LED lighting fixture includes the LED module, so that occurrence of unevenness in the brightness depending on the positional relationship with the light source can be prevented at low cost.

Therefore, the LED lighting fixture can be suitably used as a light bulb.

Herein, the "luminous intensity" is a value measured in accordance with JIS-C7801 (2009).

DETAILS OF EMBODIMENTS ACCORDING TO THE PRESENT INVENTION

Hereinafter, LED modules and LED lighting fixtures according to embodiments of the present invention will be described in detail with reference to the drawings. Incidentally, regarding the terms "front and back" for an LED module of each embodiment, in the thickness direction of the base film of the flexible printed circuit board, the term "front" denotes one side on which light-emitting diodes are disposed and the term "back" denotes the other side, which is opposite to the side on which the light-emitting diodes are disposed. Thus, the terms do not mean the front and back of the LED module in the state of use.

LED Module

First, an LED module according to an embodiment of the present invention will be described.

Figure 2:
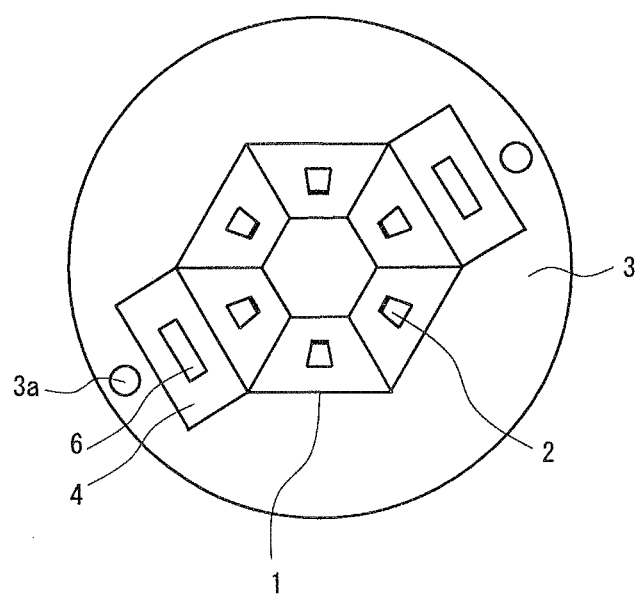
FIG. 2 is a schematic plan view illustrating the LED module in FIG. 1, viewed from the front surface side of the flexible printed circuit board.

The LED module illustrated in FIGS. 1 and 2 mainly includes plural light-emitting diodes 2 disposed on the lateral surfaces of a truncated right pyramid part 1. Specifically, the LED module includes the plural light-emitting diodes 2, a metal base material 3 having a protrusion having substantially the same shape as the truncated right pyramid part 1, a flexible printed circuit board 4 disposed on the front surface side of the metal base material 3 so as to conform to the protrusion, and a heat sink 5 disposed on the back surface side of the metal base material 3. The truncated right pyramid part 1 is constituted by a part of the flexible printed circuit board 4, the part being disposed so as to conform to the protrusion of the metal base material 3. The truncated right pyramid part 1 is formed such that the bottom surface (the surface having a larger area out of two surfaces opposite to each other in the height direction in the truncated right pyramid part 1) is positioned on the metal base material 3 side, and the bottom surface and the top surface (the surface opposite to the bottom surface) extend so as to be substantially parallel to the front surface of the metal base material 3. The plural light-emitting diodes 2 are disposed in a region of the front surface of the flexible printed circuit board 4, the region forming the lateral surfaces of the truncated right pyramid part 1.

<Metal Base Material>

The metal base material 3 is a bulk or plate member formed of metal and has a protrusion in the central portion. This protrusion has substantially the same shape as the truncated right pyramid part 1. The flexible printed circuit board 4 is disposed so as to conform to this protrusion to thereby form the truncated right pyramid part 1.

Examples of the metal for forming the metal base material 3 include aluminum, magnesium, copper, iron, nickel, molybdenum, and tungsten. Of these, aluminum, which is excellent in terms of heat transfer, processability, and light-weight, is particularly preferred.

Regarding the size of the metal base material 3, in the case of the bulk member, the size is not limited. In the case of the metal plate, the lower limit of the average thickness is preferably 0.3 mm, more preferably 0.5 mm. The upper limit of the average thickness of the metal base material 3 is preferably 4 mm, more preferably 3 mm. When the average thickness of the metal base material 3 is less than the lower limit, the metal base material 3 may have an insufficient strength. Conversely, when the average thickness of the metal base material 3 is more than the upper limit, formation of the protrusion by press molding or the like may become difficult to perform and the LED module may have an excessively large weight or volume.

The plan view shape of the metal base material 3 can be appropriately designed in accordance with the shape of the lighting fixture that is to include the LED module. For example, the shape may be circular as illustrated in FIGS. 1 and 2 or may be polygonal. When the metal base material 3 is formed so as to have a plan view shape that is circular as illustrated in FIGS. 1 and 2, it may have a diameter of, for example, 10 mm or more and 200 mm or less.

The method for forming the protrusion of the metal base material 3 is not particularly limited; however, the protrusion can be formed with ease and certainty by die casting, cold forging, cutting, or press molding. Specifically, a metal mold having the shape of the protrusion is placed so as to face a flat metal plate and is used to press the flat metal plate, so that the metal base material 3 having the protrusion can be formed.

The metal base material 3 has through holes 3a through which lead wires are passed for establishing connections between a power supply circuit for supplying power to the LED module and the conductive pattern 4b of the flexible printed circuit board 4. In FIGS. 1 and 2, such a through hole 3a is formed at each of positions facing each other with the truncated right pyramid part 1 therebetween: in total, two through holes 3a are formed. However, the positions at which the through holes 3a are formed are not limited to these positions; a through hole 3a may be formed at a position that facilitates establishment of a connection between a connector 6 described later and a lead wire.

<Flexible Printed Circuit Board>

Figure 3A:
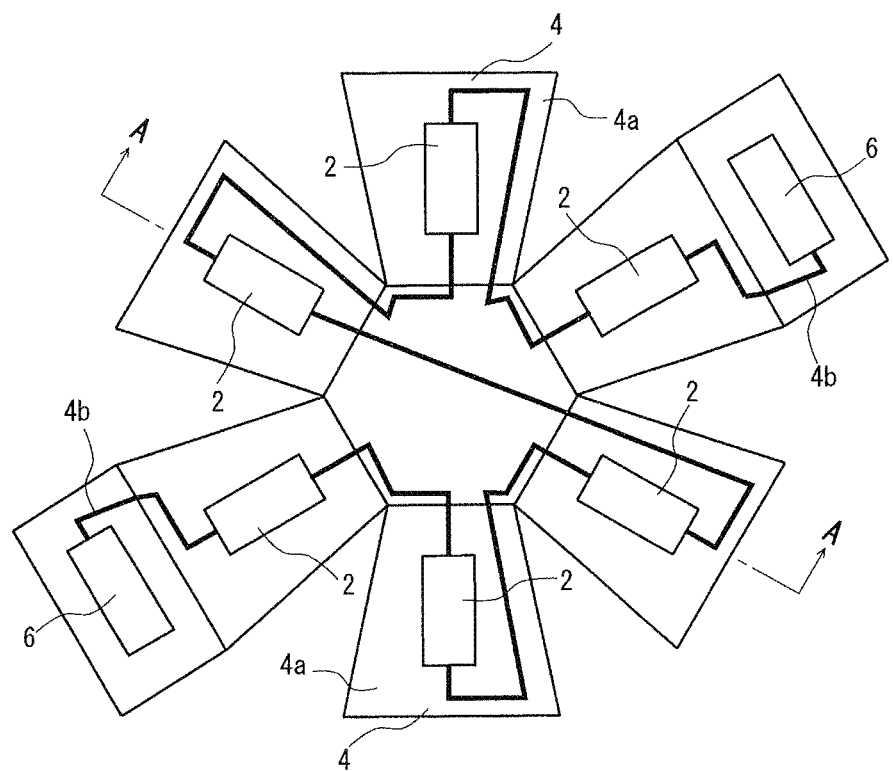
FIG. 3A is a schematic plan view of a planar development of the flexible printed circuit board on which light-emitting diodes are mounted in FIG. 1.
Figure 3B:
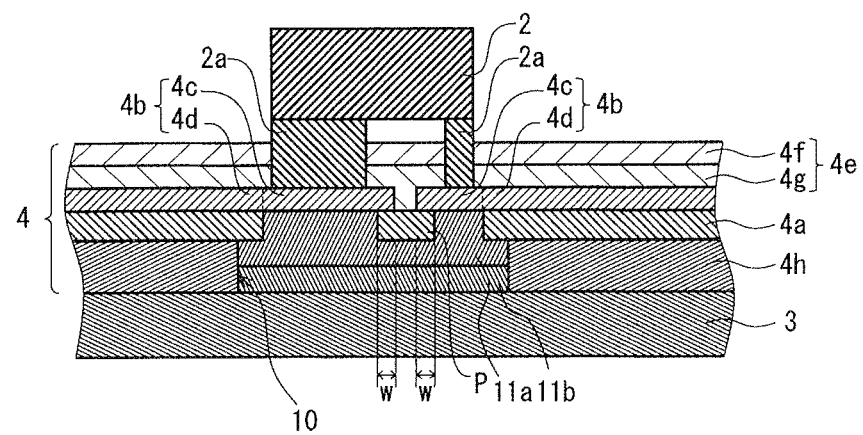
FIG. 3B is a schematic partial sectional view taken along line A-A in FIG. 3A.

As illustrated in FIGS. 3A and 3B, the flexible printed circuit board 4 mainly includes a base film 4a having flexibility and an insulating property, the conductive pattern 4b disposed on the front surface side of the base film 4a, and a coverlay 4e disposed on the front surface of the base film 4a and the front surface of the conductive pattern 4b. The conductive pattern 4b includes plural land parts 4c and wiring parts 4d connected to the land parts 4c. On the land parts 4c, light-emitting diodes 2 are disposed (mounted) via solder 2a so as to be electrically connected. In the coverlay 4e, openings are formed at positions corresponding to the plural land parts 4c. FIG. 3A is a planar development of the flexible printed circuit board 4 that is to be disposed so as to conform to the protrusion of the metal base material 3. For simplicity, the coverlay 4e is not illustrated in FIG. 3A.

(Base Film)

The base film 4a of the flexible printed circuit board 4 is constituted by a sheet-shaped member having an insulating property and flexibility. Specifically, this sheet-shaped member forming the base film 4a may be a resin film. Preferred examples of the main component of the resin film include polyimide and polyethylene terephthalate. The base film 4a may contain filler and additives, for example. The term "main component" means a component contained so as to account for 50% by mass or more.

As illustrated in FIG. 3A, the base film 4a has a planar shape in which plural trapezoids having the same shape are bonded to a regular polygon such that the upper sides of the trapezoids meet the sides of the regular polygon. The light-emitting diodes 2 are mounted only on the plural trapezoidal parts. The base film 4a is bent along bonding sides between the regular polygon and the trapezoids so as to conform to the protrusion of the metal base material 3; the regular polygon part is disposed on the top surface of the protrusion of the metal base material 3 and the trapezoidal parts are disposed on the lateral surfaces of the protrusion.

Rectangular parts are further bonded to the lower sides of two opposing trapezoidal parts of the base film 4a. The connectors 6 described later are mounted on these rectangular parts. When the base film 4a is disposed on the metal base material 3, it is also bent along bonding sides between the trapezoids and the rectangles, so that the rectangular parts are disposed on a flat surface around the protrusion of the metal base material 3. However, the parts on which the connectors 6 are mounted are not limited to the rectangular shapes and the positions illustrated in FIGS. 1 to 3A. The connectors 6 may be formed on parts having desired shapes at desired positions. Alternatively, such parts may be omitted when the connectors 6 are mounted on trapezoidal parts.

The base film 4a preferably has a shape such that, when it is placed so as to conform to the protrusion of the metal base material 3, oblique sides of adjacent trapezoidal parts come into contact with each other. When the base film 4a has this shape that allows contact between the oblique sides of the trapezoidal parts, exposure of the surface of the metal base material 3 is prevented in the truncated right pyramid part 1, to thereby enhance the uniformity of luminous intensity and the aesthetic property of the LED module.

The lower limit of the average thickness of the base film 4a is preferably 9 µm, more preferably 12 µm. The upper limit of the average thickness of the base film 4a is preferably 50 µm, more preferably 38 µm. When the average thickness of the base film 4a is less than the lower limit, the base film 4a may have an insufficient strength. Conversely, when the average thickness of the base film 4a is more than the upper limit, it may become difficult to bend the base film 4a into the shape of a right cone or pyramid so as to conform to the protrusion.

(Conductive Pattern)

The conductive pattern 4b includes the plural land parts 4c and the wiring parts 4d connected to the land parts 4c. The conductive pattern 4b is formed by etching a metal layer on the front surface of the base film 4a so as to have a desired planar shape (pattern). On each trapezoidal part of the base film 4a, a single land part 4c is formed. The light-emitting diodes 2 are individually mounted on such land parts 4c. The wiring parts 4d are formed so as to connect the plural land parts 4c and the connectors 6 in series.

The conductive pattern 4b can be formed of a conductive material; in general, it is formed of copper, for example.

The lower limit of the average thickness of the conductive pattern 4b is preferably 5 µm, more preferably 8 µm. The upper limit of the average thickness of the conductive pattern 4b is preferably 75 µm, more preferably 50 µm. When the average thickness of the conductive pattern 4b is less than the lower limit, the continuity may be insufficient. Conversely, when the average thickness of the conductive pattern 4b is more than the upper limit, the flexible printed circuit board 4 may have insufficient flexibility.

(Adhesive Layer)

The flexible printed circuit board 4 further includes an adhesive layer 4h formed on the back surface of the base film 4a and it is bonded via the adhesive layer 4h to the metal base material 3. The adhesive layer 4h mainly contains an adhesive that allows the base film 4a to be bonded to the metal base material 3. The adhesive is not particularly limited and examples thereof include thermosetting adhesives such as epoxy adhesives, silicone adhesives, and acrylic adhesives. The adhesive layer 4h may contain additives according to the need. However, it is not necessary to impart thermal conductivity to the adhesive layer 4h because the LED module includes thermally conductive adhesive layers 11a and 11b described later.

The lower limit of the average thickness of the adhesive layer 4h is preferably 5 µm, more preferably 10 µm. The upper limit of the average thickness of the adhesive layer 4h is preferably 50 µm, more preferably 25 µm. When the average thickness of the adhesive layer 4h is less than the lower limit, the bonding strength between the flexible printed circuit board 4 and the metal base material 3 may be insufficient. Conversely, when the average thickness of the adhesive layer 4h is more than the upper limit, the LED module may have an excessively large thickness or the increase in the distance between the conductive pattern 4b and the metal base material 3 may result in an insufficient heat dissipation property.

The adhesive layer 4h has an opening that defines the back side portion of a recess 10 filled with the thermally conductive adhesive layers 11a and 11b described later. The size of this back side portion, that is, the size of the opening of the back side portion of the recess 10 in the adhesive layer 4h is larger than the size of the front side portion of the recess 10, that is, the size of the opening of the recess 10 in the base film 4a described later. In this way, the opening of the recess 10 in the adhesive layer 4h is formed as a large opening, to thereby facilitate the process of filling the opening with the thermally conductive adhesive layers 11a and 11b. In addition, when the front side portion of the recess 10 is formed by removal of the base film 4a and subsequently the adhesive layer 4h having the opening defining the back side portion of the recess 10 is disposed, alignment between these portions is easily achieved.

(Recess)

Figure 3C:
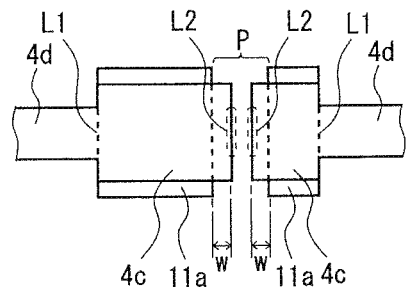
FIG. 3C is a schematic partial plan view of the flexible printed circuit board in FIG. 3A, viewed from the front surface side of the circuit board.

The LED module has, in the back surface of the flexible printed circuit board 4, a recess 10 reaching the back surface of the conductive pattern 4b in at least a portion of the projection region of the plural land parts 4c on which a light-emitting diode 2 is mounted. As illustrated in FIG. 3C, within the recess 10, the base film 4a remains in a remaining region P including, in plan view substantially perpendicular to the surface of the flexible printed circuit board 4, peripheral edges L2 of the plural land parts 4c, the peripheral edges L2 being opposite to connection edges L1 connected to the wiring parts 4d. This remaining region P is also a region between a pair of land parts 4c. The base film 4a is thus left, so that, during bonding of the flexible printed circuit board 4 to the metal base material 3, even when the peripheral edges L2, which are opposite to the connection edges L1 (of the land parts 4c) connected to the wiring parts 4d, are pressed and bent toward the back surface side of the flexible printed circuit board 4, the base film 4a in the remaining region P can prevent short circuits between the land parts 4c and the metal base material 3. Incidentally, the coverlay 4e is not illustrated in FIG. 3C. The term "connection edge connected to the wiring part" means the boundary between the wiring part and the land part. The term "peripheral edge opposite to the connection edge connected to the wiring part" means a portion of the peripheral edge of the land part, the portion being intersected by imaginary lines each passing through a point on the connection edge and the geometric centroid of the land part.

The recess 10 is formed in a region overlapping the projection region of the light-emitting diode 2 mounted on the land part 4c, which is positioned on the bottom surface of the recess 10. In other words, the front side portion of the recess 10 is formed by removing the base film 4a for a region covering the projection region of the light-emitting diode 2 except for the remaining region P. The back side portion of the recess 10 is formed in a region covering the projection region of the front side portion. As a result, as described above, the opening of the recess 10 is formed so as to have a stepwise increase in the diameter in the thickness direction: the diameter is large at the position of the adhesive layer 4h (back side portion) on the back side, and the diameter is small at the position of the base film 4a (front side portion) on the front side.

In the flexible printed circuit board 4 in FIGS. 3A and 3B, the whole projection region of the plural land parts 4c overlaps the opening region of the recess 10 in the base film 4a (front side portion, which includes the remaining region P) in plan view. However, as long as the effect of enhancing heat transfer according to the present invention is provided, a portion of the projection region of the land parts 4c may not overlap the opening region of the recess 10 in the base film 4a. The lower limit of the ratio of the overlap area (except for the remaining region P) between the recess 10 in the base film 4a and the land parts 4c to the total area of the land parts 4c is preferably 80%, more preferably 90%, still more preferably 95%. When the area ratio is less than the lower limit, the LED module may exert an insufficient heat transfer effect.

Figure 3D:
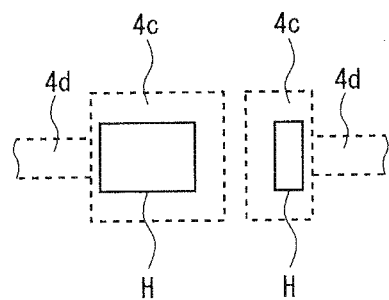
FIG. 3D is a schematic partial plan view of the flexible printed circuit board in FIG. 3A, viewed from the front surface side of the circuit board.

In the flexible printed circuit board 4 in FIG. 3B, at least the front side portion of the recess 10 is formed in a region at least covering the projection regions of the openings of the coverlay 4e formed so as to correspond to the plural land parts 4c. In addition, at least the front side portion of the recess 10 is formed in a region at least covering the projection region of the light-emitting diode 2. The coverlay 4e is present between the plural land parts 4c in plan view substantially perpendicular to the surface of the flexible printed circuit board 4. As illustrated in FIG. 3D, the projection regions of the openings H of the coverlay 4e of the flexible printed circuit board 4 in FIG. 3B are smaller than the projection regions of the land parts 4c and present within the projection regions of the land parts 4c. In other words, the land parts 4c are partially exposed through the openings H.

The upper limit of the opening area of the recess 10 in the base film 4a is preferably 2 times, more preferably 1.8 times, still more preferably 1.5 times, the projection area of the light-emitting diode 2. When the opening area of the recess 10 in the base film 4a is more than the upper limit, a large region of the base film 4a is removed, which may result in insufficient insulation reliability during bending of the flexible printed circuit board 4, for example. The term "opening area of the recess" means the area of the bottom surface of the recess (exposed back surface of the conductive pattern or coverlay) and does not include the area of the remaining region P.

The lower limit of the difference between the opening diameter of the recess 10 in the base film 4a (diameter of the front side portion) and the opening diameter of the recess 10 in the adhesive layer 4h (diameter of the back side portion) is preferably 2 μm, more preferably 40 μm, still more preferably 100 μm. The upper limit of the difference between the opening diameter of the recess 10 in the base film 4a and the opening diameter of the recess 10 in the adhesive layer 4h is preferably 1000 μm, more preferably 600 μm, still more preferably 200 μm. When the difference between the opening diameter of the recess 10 in the base film 4a and the opening diameter of the recess 10 in the adhesive layer 4h is less than the lower limit, the process of filling the recess 10 with the thermally conductive adhesive layers 11a and 11b may not be sufficiently facilitated. Conversely, when the difference between the opening diameter of the recess 10 in the base film 4a and the opening diameter of the recess 10 in the adhesive layer 4h is more than the upper limit, the filling amount of the thermally conductive adhesive layers 11a and 11b increases, which may result in an excessively high cost for the LED module or a decrease in the bonding strength to the metal base material 3. Incidentally, the term "opening diameter" means the diameter of a perfect circle having the same area as the opening.

The lower limit of a mean overlapped width w between the projection region of the remaining portion of the base film 4a (remaining region P) and the projection region of one of the land parts 4c (one of the left and right land parts 4c in FIG. 3B) is preferably 10 μm, more preferably 30 μm, still more preferably 50 μm. The upper limit of the mean overlapped width w is preferably 500 μm, more preferably 300 μm, still more preferably 100 μm. When the mean overlapped width w is less than the lower limit, the effect of preventing short circuits between the land parts 4c and the metal base material 3 may be insufficiently exerted. Conversely, when the mean overlapped width w is more than the upper limit, the heat dissipation effect due to the recess 10 and the thermally conductive adhesive layers 11a and 11b may be insufficiently exerted. The term "mean overlapped width" means a value calculated by dividing the overlapped area between the projection region of the land part 4c and the projection region of the remaining portion of the base film 4a by the length of a portion of the peripheral edge of the projection region of the land part 4c, the portion overlapping the projection region of the remaining portion of the base film 4a.

(Thermally Conductive Adhesive Layers)

The LED module includes the thermally conductive adhesive layers 11a and 11b. The thermally conductive adhesive layers 11a and 11b are used to fill the recess 10 to bond together the conductive pattern 4b and the metal base material 3. Specifically, the thermally conductive adhesive layers are a first thermally conductive adhesive layer 11a formed on the back surface of the conductive pattern 4b and used to fill the front surface portion of the recess 10, and a second thermally conductive adhesive layer 11b formed on the back surface of the first thermally conductive adhesive layer 11a and used to fill the back surface portion of the recess 10. In this way, the thermally conductive adhesive layers are formed as two separate layers, so that the first layer (first thermally conductive adhesive layer 11a) having been formed can be inspected for voids and subsequently the second layer (second thermally conductive adhesive layer 11b) can be formed. Thus, filling with adhesive is achieved with certainty, so that degradation of the heat transfer property and bonding strength can be prevented.

The thermally conductive adhesive layers 11a and 11b each contain an adhesive resin component and a thermally conductive filler.

Examples of the adhesive resin component include polyimide, epoxy, alkyd resins, urethane resins, phenolic resins, melamine resins, acrylic resins, polyamide, polyethylene, polystyrene, polypropylene, polyester, vinyl acetate resins, silicone resins, and rubber. As the adhesive resin component, an adhesive mainly containing an acrylic resin, a silicone resin, a urethane resin, or the like is used, so that the flexible printed circuit board 4 can be bonded to the metal base material 3 with ease and certainty.

Examples of the thermally conductive filler include metal oxides and metal nitrides. Examples of the metal oxides include aluminum oxide, silicon oxide, beryllium oxide, and magnesium oxide. Of these, aluminum oxide is preferred from the standpoint of the electric insulation property, thermal conductivity, and price, for example. Examples of the metal nitrides include aluminum nitride, silicon nitride, and boron nitride. Of these, boron nitride is preferred from the standpoint of the electric insulation property, thermal conductivity, and low dielectric constant. Incidentally, the metal oxides and the metal nitrides may be used in combination of two or more thereof.

The lower limit of the content of the thermally conductive filler in the thermally conductive adhesive layers 11a and 11b is preferably 40 vol %, more preferably 45 vol %. The upper limit of the content of the thermally conductive filler is preferably 85 vol %, more preferably 80 vol %. When the content of the thermally conductive filler is less than the lower limit, the thermal conductivity of the thermally conductive adhesive layers 11a and 11b may be insufficient. Conversely, when the content of the thermally conductive filler is more than the upper limit, entry of bubbles tends to occur during mixing of the adhesive resin component and the thermally conductive filler, which may result in a decrease in the voltage endurance. Incidentally, the thermally conductive adhesive layers 11a and 11b may contain, in addition to the thermally conductive filler, additives such as a curing agent.

The lower limit of the thermal conductivity of the thermally conductive adhesive layers 11a and 11b is preferably 1 W/mK, more preferably 2 W/mK. The upper limit of the thermal conductivity of the thermally conductive adhesive layers 11a and 11b is preferably 20 W/mK. When the thermal conductivity of the thermally conductive adhesive layers 11a and 11b is less than the lower limit, the heat dissipation effect of the LED module may be insufficient. Conversely, when the thermal conductivity of the thermally conductive adhesive layers 11a and 11b is more than the upper limit, the content of the thermally conductive filler is excessively high and entry of bubbles tends to occur during mixing of the adhesive resin component and the thermally conductive filler, which may result in a decrease in the voltage endurance or may result in an excessively high cost.

The second thermally conductive adhesive layer 11b preferably has a lower thermal conductivity than the first thermally conductive adhesive layer 11a. In other words, the second thermally conductive adhesive layer 11b preferably has a lower content of the thermally conductive filler than the first thermally conductive adhesive layer 11a. In this way, the first thermally conductive adhesive layer 11a is formed so as to have a high content of the thermally conductive filler and the second thermally conductive adhesive layer 11b is formed so as to have a low content of the thermally conductive filler, so that the heat dissipation effect of the whole thermally conductive adhesive layers is maintained and the bonding strength to the metal base material 3 can be enhanced.

The adhesive for forming the first thermally conductive adhesive layer 11a preferably has a higher thixotropy than the adhesive for forming the second thermally conductive adhesive layer 11b. Compared with the second thermally conductive adhesive layer 11b, the adhesive for the first thermally conductive adhesive layer 11a thus has a high thixotropy, so that the degree to which the recess 10 can be filled with the adhesive is high and the first thermally conductive adhesive layer 11a can be formed with ease and certainty. Incidentally, the thixotropy is the index of a property in which viscosity decreases under application of a force and the original viscosity is recovered after leaving at rest. The thixotropy is represented by, for example, a ratio calculated by dividing a viscosity at a low shear rate by a viscosity at a high shear rate.

The thermally conductive adhesive layers 11a and 11b preferably have a high insulating property. Specifically, the lower limit of the volume resistivity of the thermally conductive adhesive layers 11a and 11b is preferably $1\times10^8$ Ωcm, more preferably $1\times10^{10}$ Ωcm. When the volume resistivity of the thermally conductive adhesive layers 11a and 11b is less than the lower limit, the thermally conductive adhesive layers 11a and 11b may have an insufficient insulating property so that the conductive pattern 4b may be electrically connected to the metal base material 3, which is disposed on the back surface side of the base film 4a. Incidentally, the volume resistivity is a value measured in accordance with JIS-C2139 (2008).

The average thickness of the entirety of the thermally conductive adhesive layers 11a and 11b (the average distance from the back surface of the second thermally conductive adhesive layer 11b to the back surface of the conductive pattern 4b) is preferably larger than the total of the average thickness of the base film 4a and the average thickness of the adhesive layer 4h. Specifically, the lower limit of the average thickness of the entirety of the thermally conductive adhesive layers 11a and 11b is preferably 5 μm, more preferably 10 μm. The upper limit of the average thickness of the entirety of the thermally conductive adhesive layers 11a and 11b is preferably 100 μm, more preferably 50 μm. When the average thickness of the entirety of the thermally conductive adhesive layers 11a and 11b is less than the lower limit, the thermally conductive adhesive layers 11a and 11b may be insufficiently in contact with the metal base material 3, which is disposed on the back surface side of the base film 4a, and the heat transfer effect may be insufficiently exerted. Conversely, when the average thickness of the entirety of the thermally conductive adhesive layers 11a and 11b is more than the upper limit, the filling amount of the thermally conductive adhesive layers 11a and 11b increases, which may result in an increase in the cost or may result in an excessively large thickness of the LED module.

The lower limit of the ratio of the average thickness of the second thermally conductive adhesive layer 11b to the average thickness of the first thermally conductive adhesive layer 11a is preferably 0.1, more preferably 0.2. The upper limit of the ratio of the average thickness of the second thermally conductive adhesive layer 11b to the average thickness of the first thermally conductive adhesive layer 11a is preferably 2, more preferably 1.5. When the ratio of the average thickness of the second thermally conductive adhesive layer 11b to the average thickness of the first thermally conductive adhesive layer 11a is less than the lower limit, the effect of enhancing bondability may be insufficiently exerted. Conversely, when the ratio of the average thickness of the second thermally conductive adhesive layer 11b to the average thickness of the first thermally conductive adhesive layer 11a is more than the upper limit, the heat dissipation effect may be insufficiently exerted.

(Coverlay)

The coverlay 4e is formed on portions of the front surface of the flexible printed circuit board 4 except for portions (land parts 4c) on which the light-emitting diodes 2 are mounted. The coverlay 4e has an insulating function and a bonding function and is bonded to the front surface of the base film 4a and the front surface of the conductive pattern 4b. As illustrated in FIG. 3B, when the coverlay 4e includes an insulating layer 4f and a bonding layer 4g, the insulating layer 4f may be formed of the same material as that for the base film 4a and may be formed so as to have an average thickness similar to that of the base film 4a. A preferred example of an adhesive for forming the bonding layer 4g of the coverlay 4e is an epoxy adhesive. The average thickness of the bonding layer 4g is not particularly limited, but is preferably 12.5 μm or more and 25 μm or less.

The front surface of the coverlay 4e is preferably white-colored. The white layer is thus formed on the front surface of the coverlay 4e, so that light emitted by the light-emitting diodes 2 to the flexible printed circuit board 4 is reflected, which allows an increase in the utilization ratio of light. In addition, the aesthetic property of the LED module can be enhanced. The white layer can be formed by coating a white pigment, for example.

(Connectors)

Both ends of the conductive pattern 4b are connected to connectors 6. The connectors 6 are members for electrically connecting the plural light-emitting diodes 2 to a power supply circuit configured to supply power to the LED module. The connectors 6 are mounted on land parts of the conductive pattern 4b. The connectors 6 are connected to lead wires passing through the through holes 3a of the metal base material 3, so that power for turning on the light-emitting diodes 2 is supplied.

<Truncated Right Pyramid Part>

The truncated right pyramid part 1 is a part having the shape of a truncated right pyramid whose bottom surface has the shape of a regular polygon. The lower limit of the inclination angle of the lateral surfaces with respect to the bottom surface of the truncated right pyramid part 1 is 55°, preferably 60°, more preferably 65°, particularly preferably 68°. The upper limit of the inclination angle of the lateral surfaces with respect to the bottom surface of the truncated right pyramid part 1 is 82°, preferably 80°, more preferably 75°, particularly preferably 74°. When the inclination angle is less than the lower limit, on the front surface side of the flexible printed circuit board 4 (on the protrusion side of the truncated right pyramid part 1), a luminous intensity in a direction at a large angle with respect to the central axis of the truncated right pyramid part 1 may be much lower than a luminous intensity in the central axis direction (in the forward direction) of the truncated right pyramid part 1, so that variation in luminous intensity (a ratio of a maximum luminous intensity to a minimum luminous intensity) may increase. When the inclination angle is more than the upper limit, on the front surface side of the flexible printed circuit board 4, a luminous intensity in the central axis direction of the truncated right pyramid part 1 may be much lower than a luminous intensity in a direction at a large angle with respect to the central axis of the truncated right pyramid part 1, so that variation in luminous intensity may increase.

In FIGS. 1 and 2, the bottom surface of the truncated right pyramid part 1 has a regular hexagonal shape. However, the bottom surface of the truncated right pyramid part 1 of the LED module is not limited to the regular hexagonal shape as long as angles formed between projection lines of lines normal to light-emitting surfaces of adjacent light-emitting diodes 2, the projection lines being drawn on the bottom surface, are all equal to each other and are 72° or less. However, the bottom surface of the truncated right pyramid part 1 preferably has the shape of a regular polygon, and the bottom surface preferably has an odd number of vertices. When the bottom surface has an odd number of vertices, the uniformity of luminous intensity can be more effectively enhanced.

Figure 4A:
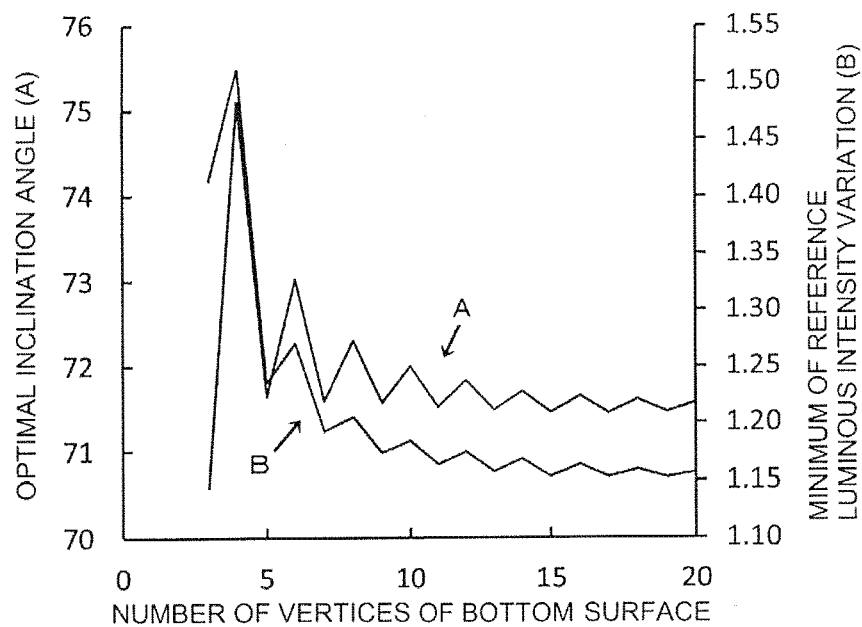
FIG. 4A is a graph illustrating the relationships between the number of vertices of the bottom surface of a truncated pyramid part and reference luminous intensity variation or optimal inclination angle.
Figure 4B:
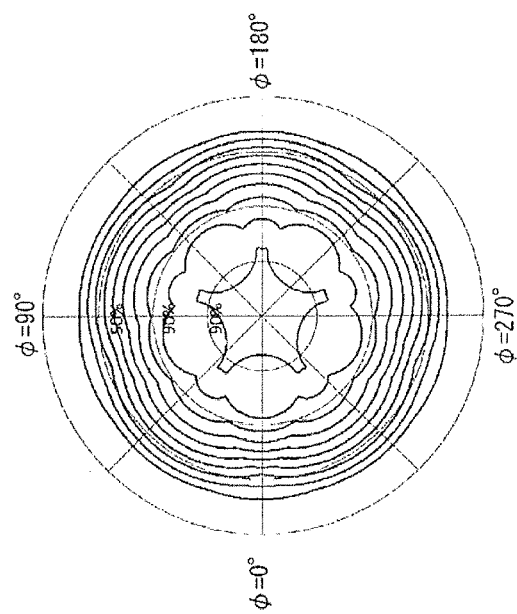
FIG. 4B includes graphs (light distribution curves) illustrating an example of the directivity of an LED module having a truncated pyramid part whose bottom surface has the shape of a regular pentagon.
Figure 4B:
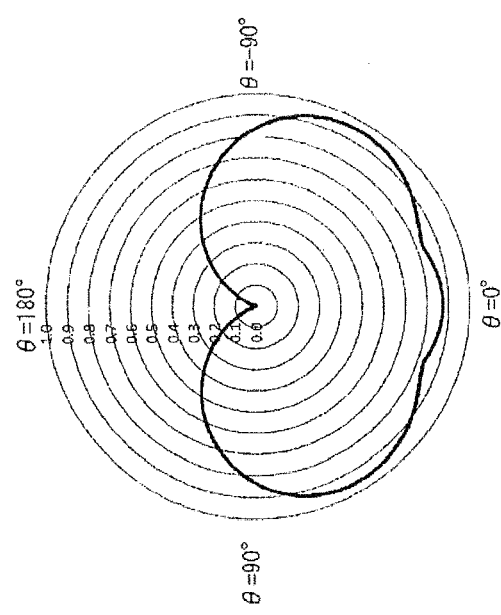
Figure 4C:
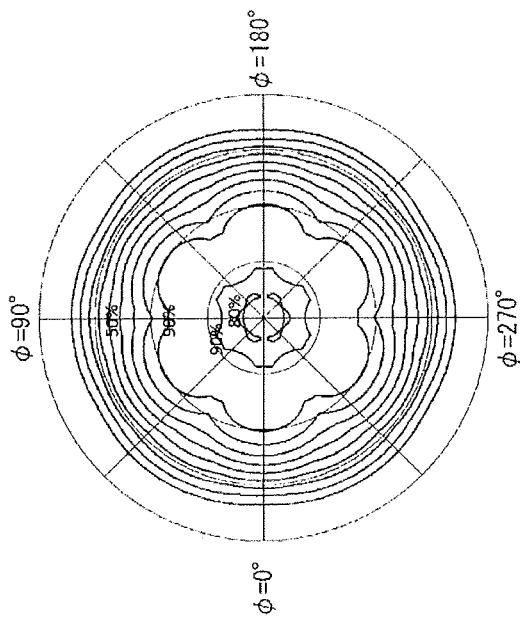
FIG. 4C includes graphs (light distribution curves) illustrating an example of the directivity of an LED module having a truncated pyramid part whose bottom surface has the shape of a regular hexagon.
Figure 4C:
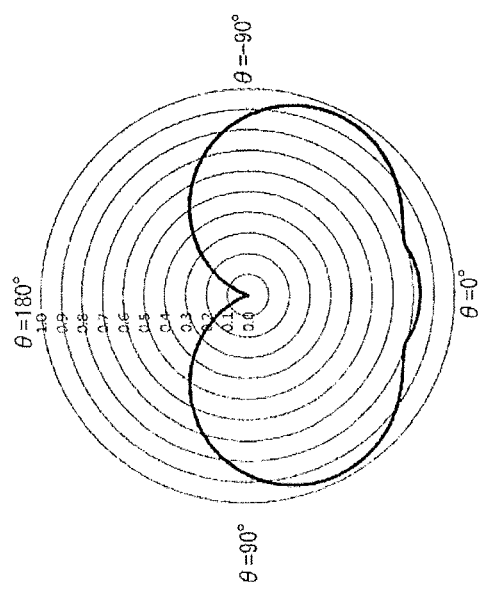
Figure 4D:
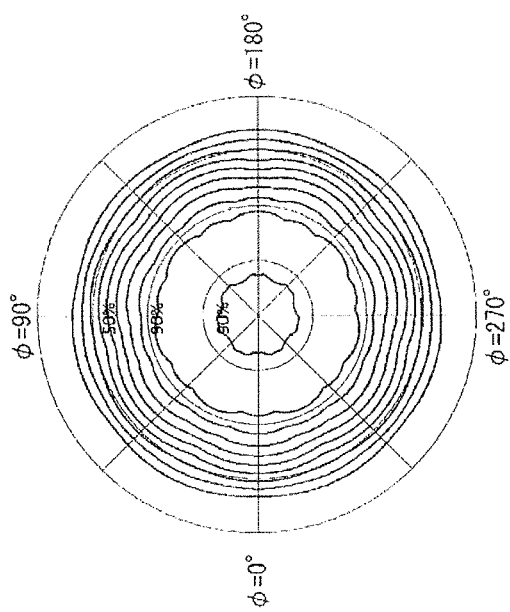
FIG. 4D includes graphs (light distribution curves) illustrating an example of the directivity of an LED module having a truncated pyramid part whose bottom surface has the shape of a regular heptagon.
Figure 4D:
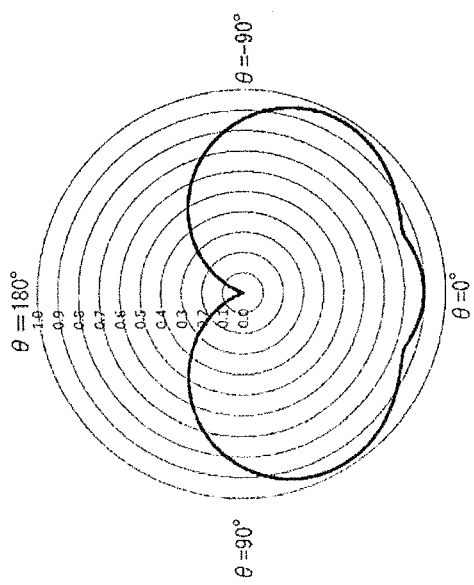

For the regular polygon of the bottom surface, the lower limit of the number of vertices is preferably 5, more preferably 7. For the bottom surface of the truncated right pyramid part 1, when the number of vertices of the regular polygon is less than 5, that is, the number of symmetries of the regular polygon is less than 5, in a −90° to 90° radial range with respect to a reference direction extending, from an origin as the center of the bottom surface of the truncated right pyramid, along the central axis toward the apex (in drawings, in the range where the angle θ with respect to the reference direction is −90° or more and 90° or less), the minimum of the ratio of the maximum luminous intensity to the minimum luminous intensity of the LED module (hereafter referred to as reference luminous intensity variation) becomes 1.4 or more as illustrated in FIG. 4A. Thus, unevenness in the brightness of the LED module may become noticeable. Incidentally, the minimum of the reference luminous intensity variation means a reference luminous intensity variation when the inclination angle of the lateral surfaces with respect to the bottom surface of the truncated right pyramid part 1 is set to an inclination angle that provides the minimum reference luminous intensity variation (hereafter referred to as an optimal inclination angle). On the other hand, for the bottom surface of the truncated right pyramid part 1, when the number of vertices of the regular polygon is 5, that is, the regular polygon has 5-fold symmetry, as illustrated in FIGS. 4A and 4B, the minimum of the reference luminous intensity variation is 1.25 or less (1.23). Thus, variation in luminous intensity tends not to be visually observed. For the bottom surface of the truncated right pyramid part 1, when the number of vertices of the regular polygon is 7, that is, the regular polygon has 7-fold symmetry, as illustrated in FIGS. 4A and 4D, the minimum of the reference luminous intensity variation is 1.2 or less (1.19). Thus, uniformity of brightness can be further enhanced. On the other hand, for the bottom surface of the truncated right pyramid part 1, when the number of vertices of the regular polygon is 6, that is, the regular polygon has 6-fold symmetry, as illustrated in FIGS. 4A and 4C, the minimum of the reference luminous intensity variation is 1.27, which is a good value; however, this minimum of the reference luminous intensity variation is larger than that in the case where the bottom surface has the shape of a regular pentagon. Accordingly, as described above, the bottom surface of the truncated right pyramid part 1 preferably has an odd number of vertices.

FIGS. 4B, 4C, and 4D are graphs relatively illustrating simulation-based results of luminous intensity in polar coordinate systems. FIGS. 4B, 4C, and 4D relate to truncated right pyramids in which the shapes of the bottom surfaces are respectively a regular pentagon, a regular hexagon, and a regular heptagon, and the same number of light-emitting diodes are disposed at the same positions on individual lateral surfaces such that the light-emitting surfaces are parallel to the lateral surfaces. The inclination angles of the lateral surfaces with respect to the bottom surfaces of the truncated right pyramids are set to optimal inclination angles (71.6° for the truncated right pyramid having the shape of a regular pentagon in FIG. 4B; 73.0° for the truncated right pyramid having the shape of a regular hexagon in FIG. 4C; and 71.6° for the truncated right pyramid having the shape of a regular heptagon in FIG. 4D). In each of these drawings, the graph on the left indicates values of luminous intensity in the −90° to 90° radial range with respect to the reference direction, the values being average values for the whole circumference around the central axis of the truncated right pyramid. The concentric circles on the left graph are graduations in increments of 10% of relative luminous intensity; the luminous intensity increases to the outside. In each of these drawings, the graph on the right indicates simulation-based luminous intensity with contour lines in the range of 360° around the central axis of the truncated right pyramid (in the drawing, in the range where the angle φ around the central axis is 0° or more and 360° or less). The concentric circles on the right graph are graduations in increments of 45° of θ (radial angle with respect to the reference direction). The magnitude of luminous intensity is indicated with contour lines in increments of 10% of relative luminous intensity. The simulations are performed on the condition that each light-emitting diode has a luminous intensity distribution illustrated in FIG. 5. This FIG. 5 corresponds to the graphs on the right in FIGS. 4B, 4C, and 4D.

On the other hand, for the bottom surface of the truncated right pyramid part 1, the upper limit of the number of vertices of the regular polygon is not particularly limited, but is preferably 20. For the bottom surface of the truncated right pyramid part 1, when the number of vertices of the regular polygon is more than the upper limit, the truncated right pyramid part 1 has small areas for lateral surfaces, so that light-emitting diodes 2 may become difficult to be disposed.

As the shape of the bottom surface of the truncated right pyramid part 1, for example, an unequal-sided pentagon may be employed. In order to effectively suppress variation in luminous intensity, the bottom surface of the truncated right pyramid part 1 preferably has the shape of a regular polygon. However, this effect can still be exerted with an unequal-sided polygon.

The truncated right pyramid part 1 is not particularly limited in terms of size and can be appropriately designed in accordance with the illuminance, size, or the like of the lighting fixture that is to include the LED module. For the bottom surface of the truncated right pyramid part 1, the circumcircle may have a diameter of 10 mm or more and 50 mm or less, for example. For the top surface of the truncated right pyramid part 1, the circumcircle may have a diameter of 1 mm or more and 30 mm or less, for example. The truncated right pyramid part 1 may have a height of 5 mm or more and 40 mm or less, for example.

<Light-Emitting Diodes>

Figure 5:
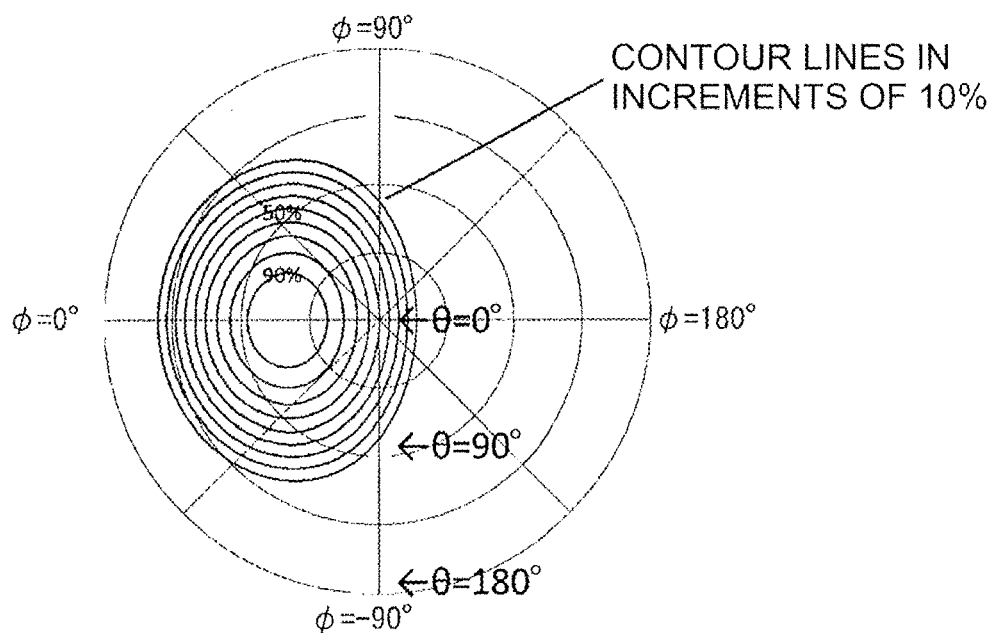
FIG. 5 is a graph (light distribution curve) illustrating the directivity of a single light-emitting diode.

The light-emitting diodes 2 are mounted on the land parts 4c of the flexible printed circuit board 4 via the solder 2a. The light-emitting diodes 2 may be light-emitting diodes that are of the multicolor emission type or the monochrome emission type and that are of the chip type or the surface mount type involving packaging with synthetic resin or the like. In order to enhance advantages according to the present invention, light-emitting diodes without lenses are preferably employed. In other words, for the LED module, light-emitting diodes that provide a luminous intensity distribution satisfying a Lambert distribution and illustrated in FIG. 5 are preferably employed. The method of connecting the light-emitting diodes 2 to the land parts 4c is not limited to use of solder and may be, for example, die bonding using conductive paste or wire bonding using metal wires.

The plural light-emitting diodes 2 are disposed only on lateral surfaces of the truncated right pyramid part 1 and not on the top surface of the truncated right pyramid part 1. The plural light-emitting diodes 2 are disposed such that the light-emitting surfaces are substantially parallel to the lateral surfaces of the truncated right pyramid part 1. The angles formed between projection lines of lines normal to light-emitting surfaces of adjacent light-emitting diodes 2, the projection lines being drawn on the bottom surface of the truncated right pyramid part 1, are all equal to each other and are 72° or less.

<Deterioration Inhibitor>

In FIGS. 1 to 3A, the number of the light-emitting diodes 2 disposed on each lateral surface of the truncated right pyramid part 1 is 1; however, the number of the light-emitting diodes 2 disposed can be appropriately designed in accordance with the illuminance, size, or the like of the lighting fixture that is to include the LED module, and the number may be 2 or more. Incidentally, the same number of the light-emitting diodes 2 are preferably disposed on each lateral surface in order to suppress variation in luminous intensity depending on direction.

The light-emitting diodes 2 are preferably disposed at the same positions of the individual lateral surfaces of the truncated right pyramid part 1. In this way, the light-emitting diodes 2 are disposed at the same positions of the individual lateral surfaces, so that the light-emitting diodes 2 can be disposed at regular intervals in the circumferential rotation direction. Thus, variation in luminous intensity can be more effectively suppressed.

<Heat Sink>

The heat sink 5 is a heat dissipation member disposed on the back surface side of the metal base material 3. The heat sink 5 is a hollow or solid cylindrical member and has a bottom surface with a shape similar to the planar shape of the metal base material 3. The heat sink 5 has through holes through which lead wires are passed, the through holes being located so as to correspond to the through holes 3a of the metal base material 3.

The material for the heat sink 5 is not particularly limited as long as it has a high heat transfer capability; however, from the standpoint of lightweight and processability, aluminum is preferably used. The heat sink 5 can be produced by machining a metal plate or a metal block; from the standpoint of cost, the metal plate is preferably used.

Incidentally, the heat sink 5 may be omitted because the metal base material 3 itself has a certain level of heat dissipation capability.

The lower limit of the average thickness of the heat sink 5 is preferably 0.3 mm, more preferably 0.5 mm. The upper limit of the average thickness of the heat sink 5 is preferably 10 mm, more preferably 8 mm. When the average thickness of the heat sink 5 is less than the lower limit, the heat dissipation effect may be insufficiently exerted. Conversely, when the average thickness of the heat sink 5 is more than the upper limit, the LED module may have an excessively large weight or volume.

<Directivity of LED Module>

In a −90° to 90° radial range with respect to the reference direction extending, from the origin as the center of the bottom surface of the truncated right pyramid part 1, along the central axis toward the apex, the upper limit of the reference luminous intensity variation is preferably 2.5, more preferably 2. When the reference luminous intensity variation is more than the range, variations in luminous intensity tend to be visually observed and unevenness in the brightness may become noticeable.

<Method for Producing LED Module>

Figure 6:
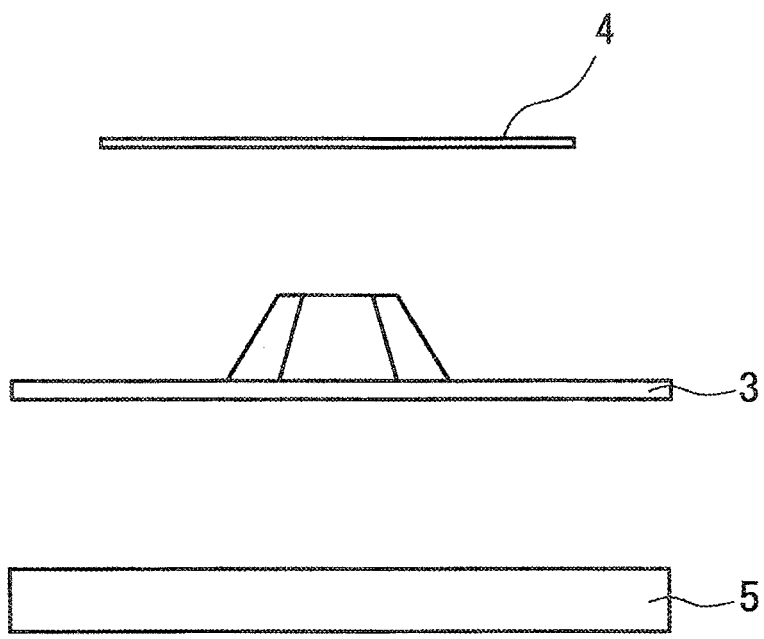
FIG. 6 is a schematic front view illustrating a method for producing the flexible printed circuit board in FIG. 1.

For example, as illustrated in FIG. 6, the LED module can be produced by a production method including a step of disposing the flexible printed circuit board 4 on the front surface side of the metal base material 3 so as to conform to the protrusion; and a step of disposing the heat sink 5 on the back surface side of the metal base material 3. Incidentally, one of the step of disposing the flexible printed circuit board 4 and the step of disposing the heat sink 5 may be performed before the other step; or both of these steps may be simultaneously performed.

As a process for disposing the flexible printed circuit board 4 on the metal base material 3, for example, a process including the following steps can be employed. First, an opening defining the front side portion of the recess 10 is formed in the base film 4*a*; and an adhesive sheet having an opening defining the back side portion of the recess 10 is disposed on the back surface of the base film 4*a*. The recess 10 is then filled with a thermally conductive adhesive. Subsequently, the flexible printed circuit board 4 is disposed on the front surface of the metal base material 3 and these members are bonded together.

Examples of a process for disposing the heat sink 5 on the metal base material 3 include a process of fastening these members together with screws and a process of bonding these members together with an adhesive. The fastening process with screws is preferably employed from the standpoint of ensuring a sufficiently high heat transfer capability.

<Advantages>

In the LED module, the plural light-emitting diodes 2 are three-dimensionally disposed at equiangular intervals of 72° or less in plan view, on lateral surfaces of the truncated right pyramid part 1 so as to be substantially parallel to the lateral surfaces; and the inclination angle of the lateral surfaces with respect to the bottom surface is set to be within a certain range. As a result, in all hemispherical directions (on the forward side of the LED module) (on the apex side) extending from the center of the bottom surface of the truncated right pyramid part 1 on which the plural light-emitting diodes 2 are disposed, variation in luminous intensity depending on the positional relationship with the light source (grouped light-emitting diodes) can be reduced. The light-emitting diodes 2 are disposed only on lateral surfaces of the truncated right pyramid part 1, so that the uniformity of luminous intensity in the above-described all hemispherical directions can be markedly enhanced. In other words, the LED module allows, without attachment of a member such as a prism, effective reduction in variation in luminous intensity on the forward side at low cost.

In the LED module, the right cone or pyramid on which the light-emitting diodes 2 are disposed is a truncated right pyramid, so that the light-emitting diodes 2 can be easily disposed on the lateral surfaces of the right cone or pyramid.

In the LED module, the flexible printed circuit board 4 on which the light-emitting diodes 2 are mounted is disposed on the metal base material 3 having a protrusion, so as to conform to the protrusion. As a result, the light-emitting diodes 2 can be disposed on the lateral surfaces of the truncated right pyramid part 1 with ease and certainty.

In the LED module, the heat sink 5 is disposed on the back surface side of the metal base material 3, so that generation of heat in the light-emitting diodes 2 can be effectively suppressed.

LED Lighting Fixture

Figure 7:
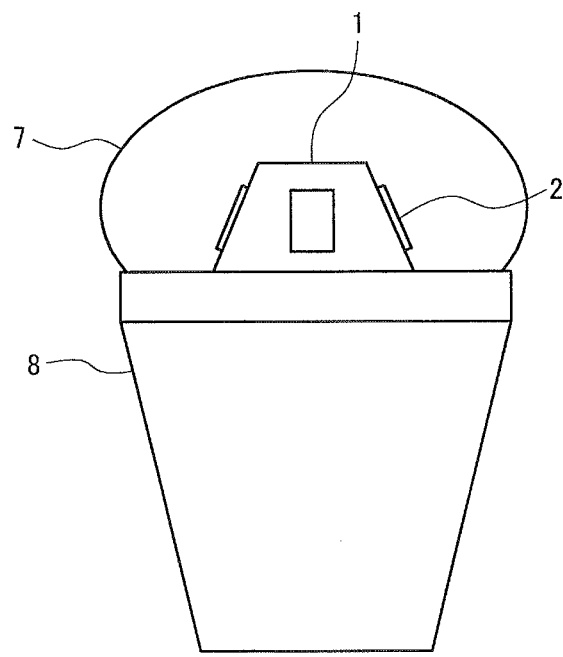
FIG. 7 is a schematic front view illustrating an LED lighting fixture according to an embodiment of the present invention.

Hereinafter, an LED lighting fixture including the LED module will be described. An LED lighting fixture in FIG. 7 is what is called an LED light bulb and mainly includes the LED module, a transparent globe 7 covering the light-emitting surfaces of the LED module, a heat dissipation member 8 containing the LED module, and a power supply circuit (not shown) configured to supply power to the LED module.

The globe 7 protects the LED module and transmits light emitted by the light-emitting diodes 2. The globe 7 can be formed with a transparent or semitransparent resin composition, for example. The globe 7 may be formed so as to have the function of diffusing light.

The heat dissipation member 8 supports the LED module and is configured to transfer heat of the light-emitting diodes 2 of the LED module to the outside. The heat dissipation member 8 is preferably formed of a material such as aluminum, as in the heat sink of the LED module. A base (not shown) is attached to an end of the heat dissipation member 8.

The power supply circuit is contained within the heat dissipation member 8 and electrically connected to the base. The power supply circuit is connected to the connectors 6 of the LED module via lead wires. Thus, power supplied via the base is supplied to the plural light-emitting diodes 2 to thereby turn on the plural light-emitting diodes 2.

<Advantages>

Since the LED lighting fixture includes the LED module, occurrence of unevenness in the brightness depending on the positional relationship with the light source can be prevented at low cost.

Other Embodiments

The embodiments disclosed herein should be understood as examples in all respects and not being limitative. The scope of the present invention is not limited to the above-described configurations of embodiments, is indicated by Claims, and is intended to embrace all the modifications within the meaning and range of equivalency of the Claims.

In the above-described embodiment, the LED module includes a laminated body of a metal base material and a flexible printed circuit board, and light-emitting diodes are mounted on the flexible printed circuit board. However, the present invention is not limited to the configuration in which light-emitting diodes are mounted on a flexible printed circuit board. For example, plural rigid printed circuit boards may be individually disposed on lateral surfaces of the protrusion of the metal base material, and light-emitting diodes may be mounted on the printed circuit boards. Alternatively, a hollow right cone or pyramid may be formed with a printed circuit board on a flat-plate metal base material not having the protrusion; or a protrusion may be formed with resin or the like on a metal base material, and a printed circuit board may be disposed so as to cover this protrusion to form a right cone or pyramid.

As the right cone or pyramid, a right cone or a truncated right cone may be used. In this case, light-emitting diodes are preferably disposed such that the light-emitting surfaces are substantially perpendicular to lines normal to the lateral surface of the right cone or the truncated right cone, and individual light-emitting diodes or grouped light-emitting diodes constituted by plural light-emitting diodes are disposed at equiangular intervals.

In the above-described embodiment, a recess is formed on the back surface side of the flexible printed circuit board and the recess is filled with the thermally conductive adhesive layer. However, the recess is not an indispensable feature in the present invention: over the entire back surface of the base film of the flexible printed circuit board, an ordinary adhesive layer or a thermally conductive adhesive layer may be disposed.

When the recess is formed, instead of the bilayer configuration of the thermally conductive adhesive layer, a single thermally conductive adhesive may be used to fill the recess to form the thermally conductive adhesive layer. The base film may be left in a region including connection edges (connected to wiring parts) of land parts in plan view. The remaining region thus formed also allows suppression of occurrence of short circuits between the metal base material and land parts being bent toward the back surface side (metal base material side).

Figure 3E:
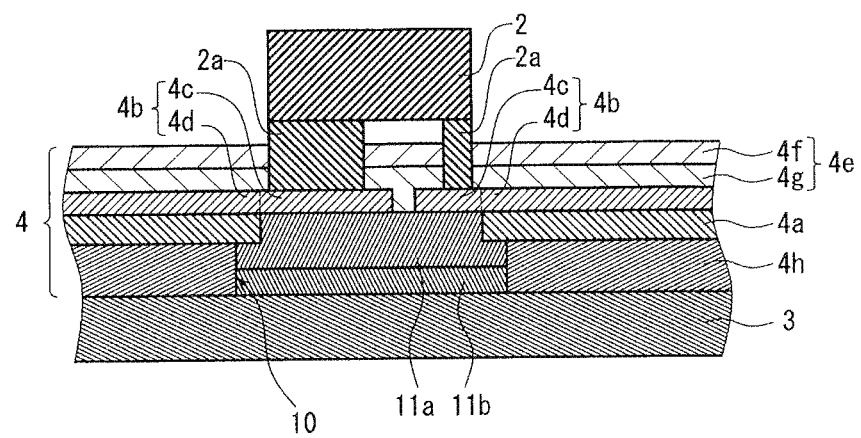
FIG. 3E is a schematic partial sectional view of an LED module according to an embodiment different from that in FIG. 3B.

The scope of the present invention also encompasses, as illustrated in FIG. 3E, an LED module in which the recess is formed and the base film is not left. In this LED module, at least the front side portion of the recess 10 is formed in a region at least covering the projection regions of the openings of the coverlay 4e that are formed at positions corresponding to the plural land parts 4c and the projection region of the light-emitting diode 2. The coverlay 4e is present between the plural land parts 4c in plan view substantially perpendicular to the surface of the flexible printed circuit board 4. In the LED module in FIG. 3E, for the recess 10 in the base film 4a, the upper limit and the lower limit of the area of the opening may be the same as in the LED module in FIG. 3B.

Figure 3F:
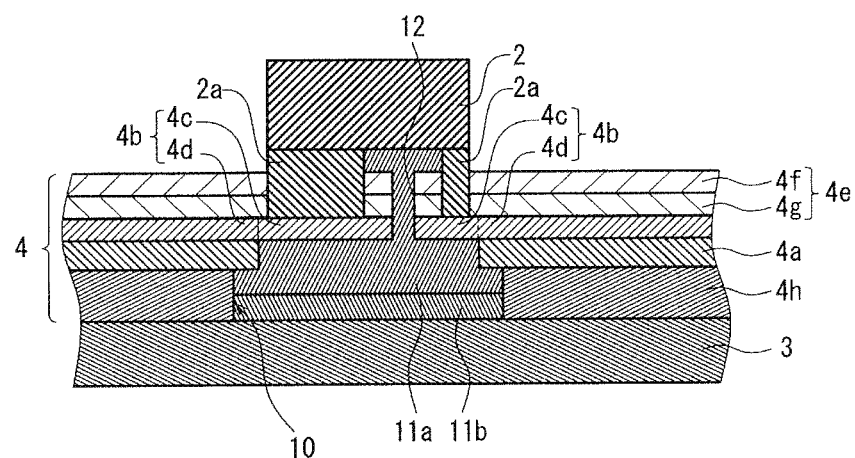
FIG. 3F is a schematic partial sectional view of an LED module according to an embodiment different from those in FIG. 3B and FIG. 3E.

As illustrated in FIG. 3F, in the LED module, the flexible printed circuit board 4 may have a through hole 12 in the projection region of the plural land parts 4c. The through hole 12 is formed in the projection region of the plural land parts 4c so as to extend through the conductive pattern 4b and the coverlay 4e of the flexible printed circuit board 4. The through hole 12, the back surface side portion thereof, and a portion above the through hole 12 are filled with a thermally conductive adhesive, so that the thermally conductive adhesive is in contact with the back surface of the light-emitting diode 2. Thus, the effect of dissipating heat from the light-emitting diodes 2 can be further enhanced. In addition, during filling with the thermally conductive adhesive, the thermally conductive adhesive can be prevented from leaking to the outside of the recess 10.

The lower limit of the average area of the through hole 12 is preferably 0.005 mm$^2$, more preferably 0.01 mm$^2$. The upper limit of the average area of the through hole 12 is preferably 1 mm$^2$, more preferably 0.5 mm$^2$. When the average area of the through hole 12 is less than the lower limit, the effect of preventing the thermally conductive adhesive from leaking and enhancement of the heat dissipation effect may be insufficiently exerted. Conversely, when the average area of the through hole 12 is more than the upper limit, the strength of the flexible printed circuit board 4 may decrease.

The through hole 12 may be formed before or after formation of the recess 10 or during formation of the recess 10. A process for forming the through hole 12 may be similar to the process for forming the front side portion of the recess 10. Incidentally, plural through holes 12 may be formed for a single recess 10.

In the above-described embodiment, the recess is formed so as to include the projection regions of plural land parts connected to a single light-emitting diode. Alternatively, a recess may be formed so as to correspond to plural light-emitting diodes such that it includes the projection region of a single land part connected to a single light-emitting diode and the projection region of a single land part connected to another light-emitting diode.

In the above-described embodiments, the recess is formed in a region including the projection regions of plural land parts. Alternatively, the recess may be formed so as to include the projection region of a single land part. In addition, the region where the recess is formed may include a region not overlapping the projection regions of light-emitting diodes and land parts.

Incidentally, the LED lighting fixture can also be used as lighting fixtures other than LED light bulbs.

EXAMPLES

Hereinafter, the present invention will be more specifically described with reference to examples. However, the present invention is not limited to the examples below.

Examples

Plural LED modules are prepared as Examples: in the LED module in FIG. 1, the truncated right pyramid part 1 is formed such that the bottom surface has the shape of a regular hexagon and the inclination angle of the lateral surfaces with respect to the bottom surface is 60°, 65°, 68°, 69°, 70°, 71°, 72°, 73°, 74°, 75°, 77°, 80°, or 82°, and light-emitting diodes 2 without lenses are disposed at the centers of the lateral surfaces of the truncated right pyramid part 1. In these LED modules, light-emitting diodes are not disposed on the top surfaces of the truncated right pyramid parts 1.

Comparative Examples

As Comparative examples, plural LED modules are each prepared as in Examples except that the inclination angle of the lateral surfaces with respect to the bottom surface of the truncated right pyramid part 1 is set to 40°, 50°, or 85°.

Figure 8A:
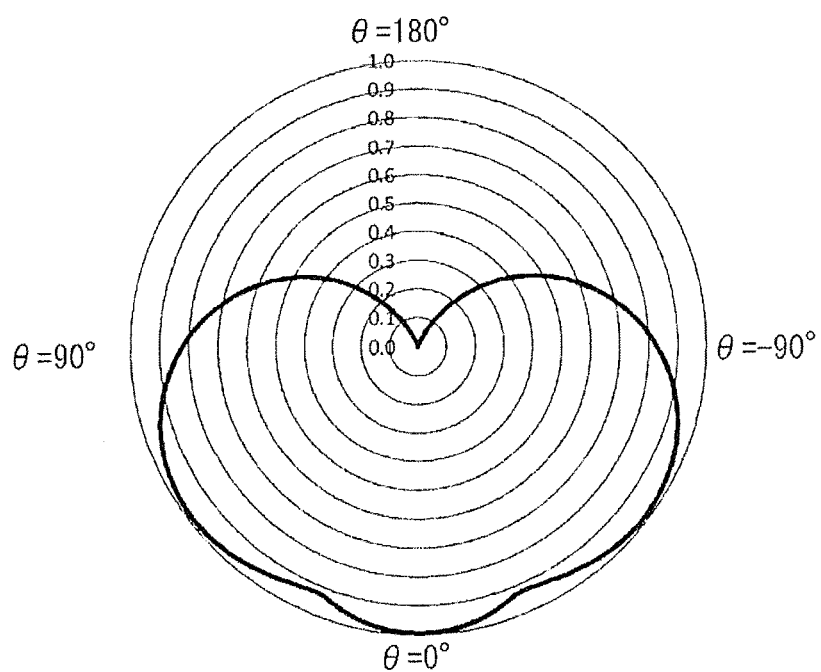
FIG. 8A is a graph (light distribution curve) illustrating the directivity of an LED module of an Example in which the inclination angle is 69°.
Figure 8B:
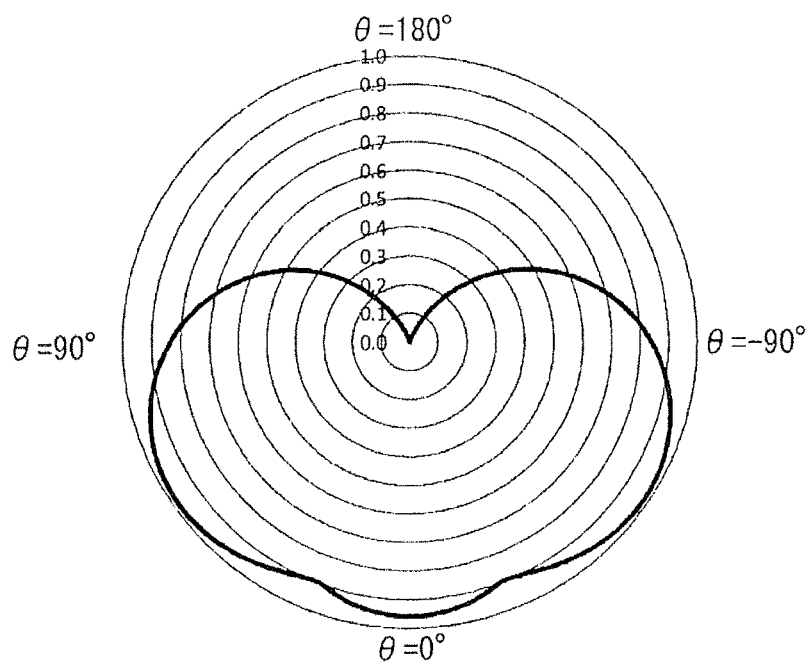
FIG. 8B is a graph (light distribution curve) illustrating the directivity of an LED module of an Example in which the inclination angle is 70°.
Figure 8C:
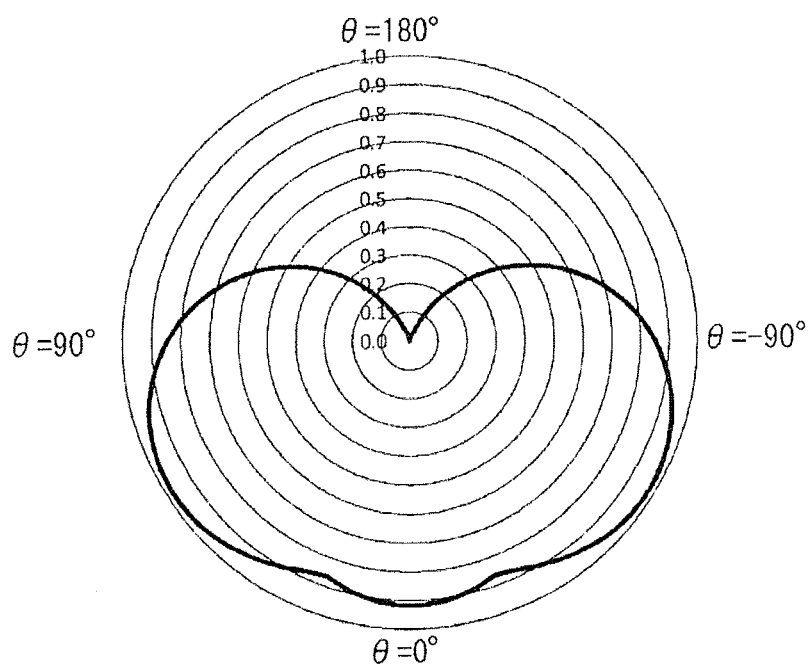
FIG. 8C is a graph (light distribution curve) illustrating the directivity of an LED module of an Example in which the inclination angle is 71°.

For the LED modules of Examples and Comparative examples, luminous intensity is calculated in a −90° to 90° radial range with respect to a reference direction extending, from the origin as the center of the bottom surface of the truncated right pyramid part 1, along the central axis toward the apex of the truncated right pyramid part 1 (hereafter referred to as a luminous intensity measurement range). Among the calculation results of luminous intensity, those of Examples in which the inclination angle is 69°, 70°, or 71° are illustrated in FIGS. 8A, 8B, and 8C. FIGS. 8A, 8B, and 8C relatively indicate, in polar coordinate systems, the luminous intensity as average values for the whole circumference around the central axis of the truncated right pyramid part 1. The concentric circles in the drawings are graduations in increments of 10% of relative luminous intensity; the luminous intensity increases to the outside. The luminous intensity was calculated on the condition that each light-emitting diode has a luminous intensity distribution in FIG. 5. The luminous intensity was calculated with analysis software "ZEMAX" by a lighting analysis in which the number of rays of each light-emitting diode was set to 100 million, in the modes of non-sequential and Far Field. Incidentally, the calculation result of luminous intensity of an Example in which the inclination angle is set to 73° is the same as the graph on the left in FIG. 4C.

Figure 9:
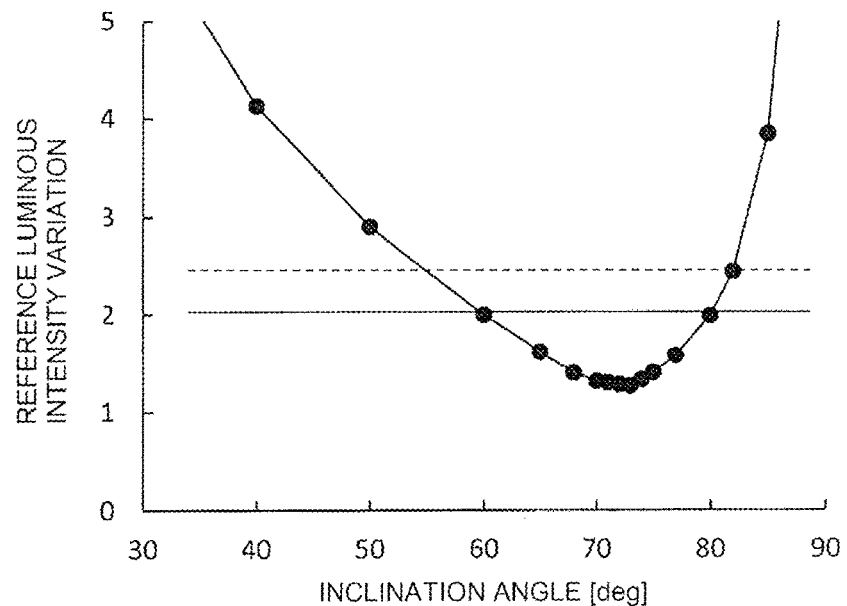
FIG. 9 is a graph illustrating the relationship between the inclination angle of a truncated pyramid part and reference luminous intensity variation.
Figure 10:
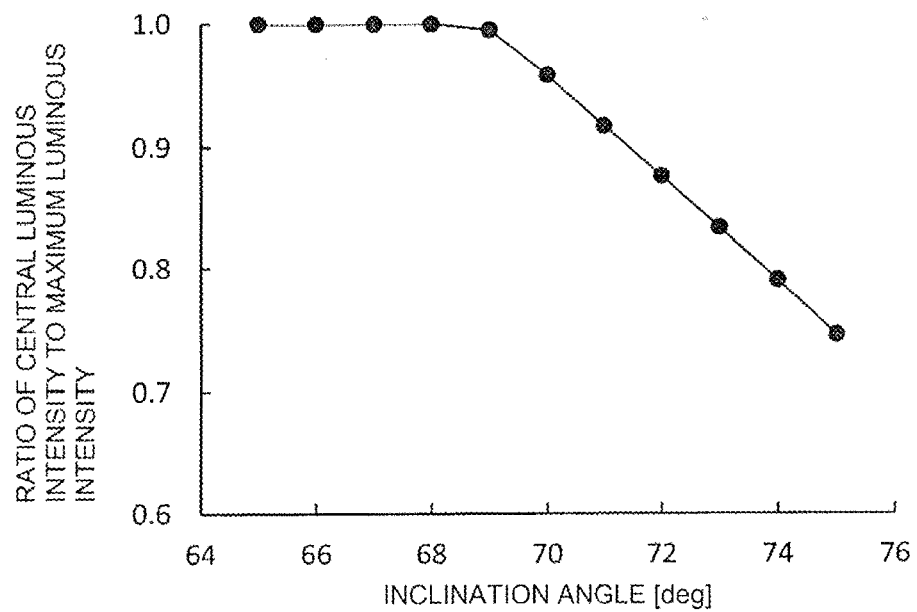
FIG. 10 is a graph illustrating the relationship between the inclination angle of a truncated pyramid part and the ratio of central luminous intensity to maximum luminous intensity.

For the calculated luminous intensities in Examples and Comparative examples, FIG. 9 illustrates the relationship between the ratio of a maximum luminous intensity to a minimum luminous intensity (reference luminous intensity variation) and the inclination angle of the truncated right pyramid part 1. For the calculated luminous intensities in the LED modules, FIG. 10 illustrates the relationship between the inclination angle of the truncated right pyramid part 1 and the ratio of a luminous intensity (central luminous intensity) in the direction along the central axis toward the apex of the truncated right pyramid part 1 to the maximum value of the calculated luminous intensities (maximum luminous intensity).

FIGS. 8A, 8B, 8C, 4C, and 9 indicate that, in the LED modules of Examples, the reference luminous intensity variation in the luminous intensity measurement range is suppressed to 2.5 or less. In addition, in Examples in which the inclination angle is set to 60° or more and 80° or less, the reference luminous intensity variation is suppressed to 2 or less. Thus, in the LED modules of Examples, variation in luminous intensity on the forward side is markedly suppressed and unevenness in the brightness depending on the positional relationship of LED modules tends not to be visually observed. As illustrated in FIG. 10, as the inclination angle of the truncated right pyramid part 1 increases, the ratio of the central luminous intensity to the maximum luminous intensity decreases and the directivity decreases. In particular, this tendency is noticeably observed in the inclination angle of 70° or more and the ratio decreases substantially in proportion to the inclination angle.

For some lighting fixtures, in particular, LED light bulbs, light distribution angles may be described. The light distribution angle is an angle formed between, with respect to the direction of the maximum luminous intensity, directions in which the luminous intensity becomes ½ of the maximum luminous intensity. Existing LED light bulbs have a light distribution angle of about 120°. In the present invention, for example, in FIGS. 8A, 8B, and 8C, the light distribution angles are about 240°; in particular, in FIG. 8C, the light distribution angle is slightly higher than 240°. These light distribution angles are achieved only by the light sources. In actual LED light bulbs, globes diffuse light to cause light scattering, resulting in even higher light distribution angles. Accordingly, LED modules according to the present invention allow lighting fixtures providing wide light distributions with ease.

INDUSTRIAL APPLICABILITY

As has been described, an LED module and an LED lighting fixture according to the present invention allow effective suppression of variation in luminous intensity on the forward side at low cost and reduction in unevenness in the brightness on the forward side.

REFERENCE SIGNS LIST

1 truncated right pyramid part
2 light-emitting diode
2a solder
3 metal base material
3a through hole
4 flexible printed circuit board
4a base film
4b conductive pattern
4c land part
4d wiring part
4e coverlay
4f insulating layer
4g bonding layer
4h adhesive layer
5 heat sink
6 connector
7 globe
8 heat dissipation member
10 recess
11a first thermally conductive adhesive layer
11b second thermally conductive adhesive layer
12 through hole
P remaining region
H opening

The invention claimed is:

1. An LED module comprising a plurality of light-emitting diodes,
  wherein the plural light-emitting diodes are disposed only on a lateral surface of a right cone, a right pyramid, a truncated right cone, or a truncated right pyramid,
  the lateral surface has an inclination angle of 55° or more and 82° or less with respect to a bottom surface,
  the plural light-emitting diodes have light-emitting surfaces substantially parallel to the lateral surface, and angles formed between projection lines of lines normal to light-emitting surfaces of adjacent light-emitting diodes or adjacent ones of grouped light-emitting diodes, the projection lines being drawn on the bottom surface, are all equal to each other and are 72° or less,
  further comprising a metal base material having, in a central portion, a protrusion having a shape of the right cone, the right pyramid, the truncated right cone, or the truncated right pyramid,
  wherein the plural light-emitting diodes are mounted on a flexible printed circuit board, and
  the flexible printed circuit board is at least disposed so as to conform to the protrusion of the metal base material;
  wherein the flexible printed circuit board includes a base film, a conductive pattern formed on a front surface side of the base film and including at least one land part and a wiring part connected to the land part, and a coverlay formed on a front surface of the conductive pattern and having an opening formed at a position corresponding to the at least one land part,
  a back surface of the flexible printed circuit board has a recess extending to a back surface of the conductive pattern, the recess corresponding to at least a portion of a projection region of the at least one land part on which each light-emitting diode is mounted,
  the flexible printed circuit board further includes thermally conductive adhesive layers filling the recess, and
  the thermally conductive adhesive layers are a first thermally conductive adhesive layer formed on the back surface of the conductive pattern and used to fill the front surface portion of the recess, and a second thermally conductive adhesive layer formed on the back surface of the first thermally conductive adhesive layer and used to fill the back surface portion of the recess,
  wherein the second thermally conductive adhesive layer has a lower thermal conductivity than the first thermally conductive adhesive layer.

2. The LED module according to claim 1, wherein the lateral surface has an inclination angle of 60° or more and 80° or less with respect to the bottom surface.

3. The LED module according to claim 1, wherein the lateral surface on which the plural light-emitting diodes are disposed includes lateral surfaces of the right pyramid or the truncated right pyramid,
  at least one light-emitting diode is disposed on each lateral surface, and
  the right pyramid or the truncated right pyramid has a bottom surface that has a polygonal shape having 5 or more vertices and interior angles all being equal to each other.

4. The LED module according to claim 3, wherein the bottom surface of the right pyramid or the truncated right pyramid has an odd number of vertices.

5. The LED module according to claim 1, wherein the lateral surface on which the plural light-emitting diodes are disposed is a lateral surface of the right cone or the truncated right cone, and the light-emitting diodes or the grouped light-emitting diodes are disposed at equiangular intervals.

6. The LED module according to claim 1, wherein the protrusion of the metal base material is formed by die casting, cold forging, cutting, or press molding.

7. The LED module according to claim 1, further comprising a heat sink on a back surface side of the metal base material.

8. The LED module according to claim 1, wherein, in plan view substantially perpendicular to a surface of the flexible printed circuit board, the base film remains in a region including at least a portion of a peripheral edge of the at least one land part.

9. The LED module according to claim 1, wherein the recess is formed in a region at least covering a projection region of the opening of the coverlay.

10. The LED module according to claim 9, wherein the recess is formed in a region at least covering a projection region of the light-emitting diode, and the coverlay is present between the plural land parts in plan view substantially perpendicular to a surface of the flexible printed circuit board.

11. The LED module according to claim 9, wherein the flexible printed circuit board has a through hole for each projection region of the at least one land part, and the thermally conductive adhesive fills the through hole and a portion above the through hole and is in contact with a back surface of the light-emitting diode.

12. The LED module according to claim 1, wherein, for the right cone, the right pyramid, the truncated right cone, or the truncated right pyramid, in a −90° to 90° radial range with respect to a reference direction extending, from an origin as a center of the bottom surface, along a central axis toward an apex, a ratio of a maximum luminous intensity to a minimum luminous intensity is 2.5 or less.

13. An LED lighting fixture comprising the LED module according to claim 1.

14. The LED lighting fixture according to claim 13, being used as a light bulb.

* * * * *